United States Patent [19]

Tomuro

[11] 4,435,656

[45] Mar. 6, 1984

[54] PHASE INVERTER CIRCUIT

[75] Inventor: Yasuta Tomuro, Hyogo, Japan

[73] Assignee: Mitsubishi Denki Kabushiki Kaisha, Tokyo, Japan

[21] Appl. No.: 360,874

[22] Filed: Mar. 22, 1982

[30] Foreign Application Priority Data

Mar. 23, 1981 [JP] Japan .................................. 56-42788

[51] Int. Cl.³ .......................... H03L 7/00; H03F 3/45
[52] U.S. Cl. .................................... 307/513; 307/262; 307/494; 330/251
[58] Field of Search ....................... 307/513, 494, 262; 330/252, 261

[56] References Cited

U.S. PATENT DOCUMENTS

| | | | |
|---|---|---|---|
| 3,170,125 | 2/1965 | Thompson | 307/494 |
| 3,241,078 | 3/1966 | Jones | 330/261 |
| 3,651,344 | 3/1972 | O'Shea | 330/252 |
| 3,670,181 | 6/1972 | Pauly | 307/262 |
| 4,001,603 | 1/1977 | Wilcox | 330/252 |
| 4,052,679 | 10/1977 | Hosoya | 307/262 |

*Primary Examiner*—John S. Heyman
*Attorney, Agent, or Firm*—Sughrue, Mion, Zinn, Macpeak & Seas

[57] ABSTRACT

A phase-inverter circuit comprising two differential current gates each comprising three transistors, the emitters of which are separated from ground by a gate current source. The signal to be inverted is applied across the bases of first and second transistors in each gate. The inverting signal is cross-applied across bases of the third transistors. The gates have the bases of their first and second transistors cross-connected. The collectors of the third transistors are connected to $V_{cc}$. The collectors of the first transistors are cross-connected to the output terminals, themselves separated from $V_{cc}$ by resistors. As a result, the number of elements cascaded between $V_{cc}$ and ground is reduced.

5 Claims, 3 Drawing Figures

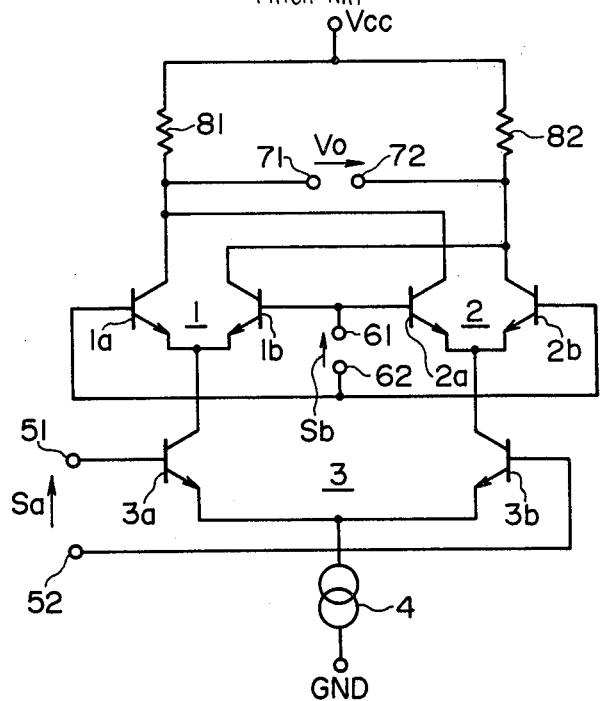
FIG. 1
PRIOR ART
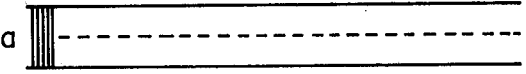
FIG. 2(a)  Sa
FIG. 2(b)  Sb
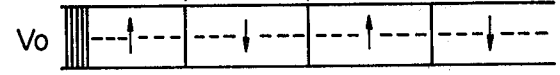
FIG. 2(c)  Vo

PHASE INVERTER CIRCUIT

BACKGROUND OF THE INVENTION

This invention relates to a phase inverter circuit which is used as a video linear IC in a servo circuit or the like in a video disk player, for inverting a phase at a desired time instant.

One example of a conventional phase inverter circuit of this type is shown in FIG. 1. The phase inverter circuit includes a first differential current gate 1 made up of transistors 1a and 1b; a second differential current gate 2 made up of transistors 2a and 2b; a third differential current gate 3 made up of transistors 3a and 3b; a constant current source 4; input signal terminals 51 and 52; input terminals 61 and 62 through which a signal whose phase is to be inverted is received; output terminals 71 and 72; and load resistors 81 and 82.

FIG. 2 is a waveform diagram for describing the operation of the circuit shown in FIG. 1. When an input signal Sa as shown in FIG. 2(a) is applied across the input terminals 51 and 52 and an input signal Sb as shown in FIG. 2(b) is applied across the input terminals 61 and 62, an output voltage Vo as shown in FIG. 2(c) is developed across the output terminals 71 and 72.

As is apparent from the above description, the phase of the output voltage Vo is inverted in response to the high and low levels of the input signal Sb.

In the above-described conventional phase inverter circuit, the circuit elements are cascade-connected between the power source terminal Vcc and the ground GND. Therefore, it is necessary to employ a high power source in order to obtain an output voltage as required. This design is thus disadvantageous when it is required to provide the phase inverter circuit in the form of an integrated circuit.

SUMMARY OF THE INVENTION

Accordingly, an object of this invention is to eliminate the above-described drawback accompanying a conventional phase inverter circuit.

More specifically, an object of the invention is to provide a phase inverter circuit in which the number of circuit elements cascade-connected between the power source terminal (Vcc) and the ground (GND) is reduced, so that a required output voltage can be obtained with a relatively low supply voltage (Vcc).

BRIEF DESCRIPTION OF THE DRAWINGS

FIG. 1 is a circuit diagram of one example of a conventional phase inverter circuit;

FIG. 2 is a waveform diagram for describing the operation of the conventional phase inverter circuit or one example of a phase inverter circuit according to this invention.

DETAILED DESCRIPTION OF THE EMBODIMENT

Figure 3:
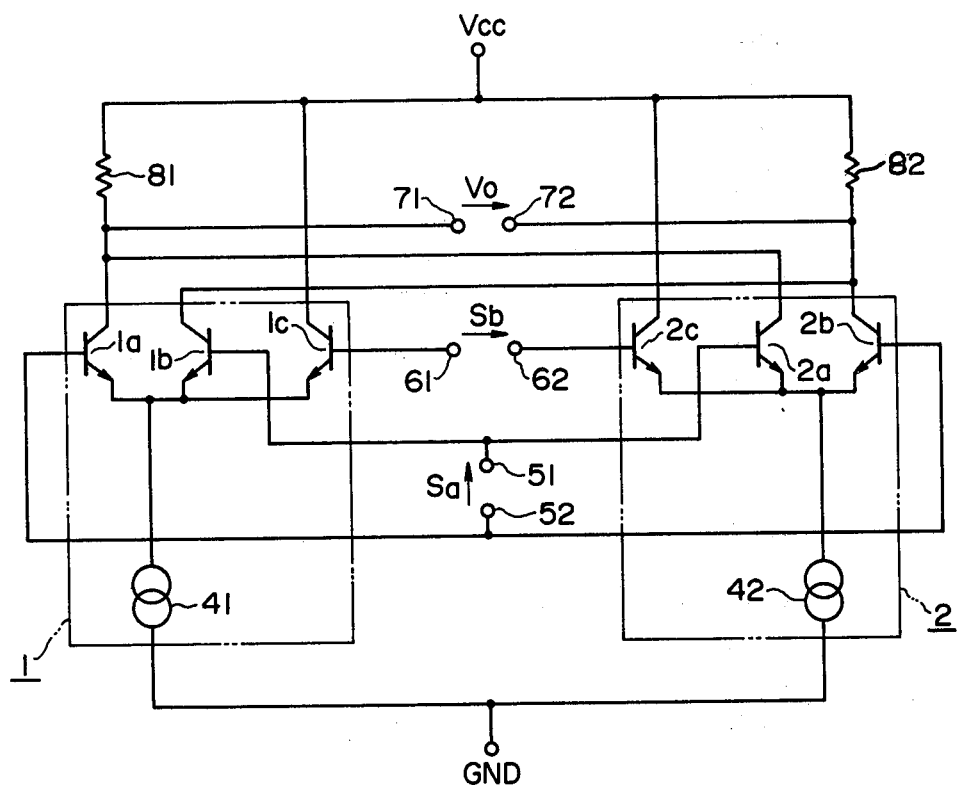
FIG. 3 is a circuit diagram illustrating one example of a phase inverter circuit according to the invention.

In the conventional phase inverter circuit, the active circuit elements are cascade-connected in three stages as shown in FIG. 1. On the other hand, the invention is intended to provide a phase inverter circuit in which the active circuit elements are cascade-connected in only two stages.

One example of a phase inverter circuit according to this invention is as shown in FIG. 3, in which those components which have been described with reference to FIG. 1 are therefore designated by the same reference numerals or characters.

A first differential current gate 1 is made up of transistors 1a, 1b and 1c, and a constant current source 41 which is connected to the common connecting point of the emitters of these transistors. Similarly, a second differential current gate 2 is made up of transistors 2a, 2b and 2c, and a constant current source 42 which is connected to the common connecting point of the emitters of these transistors.

When the base voltage of the transistor 1c is sufficiently higher than the base voltages of the transistors 1a and 1b in the first differential current gate (generally, by about 200 mV), the transistors 1a and 1b are placed in the current cut-off state, and therefore all of the current $i_1$ of the constant current source 41 flows in the transistor 1c. If, in this condition, a signal is applied across the input terminals 51 and 52, it will not appear at the output of the first differential gate 1. On the other hand, when the base voltage of the transistor 1c is sufficiently lower (generally, by about 200 mV) than the base voltages of the transistors 1a and 1b, the transistor 1c is placed in the current cut-off state, and the first differential current gate carries out ordinary differential amplification with the transistors 1a and 1b and the constant current source 41. If, under this condition, a signal is applied across the input terminals 51 and 52, it is amplified by the first differential current gate 1 and provided across the output terminals 71 and 72.

The second differential current gate 2 operates in the same way as the first differential current gate 1.

Therefore, when the input terminals 61 and 62 are at a high potential and a low potential, respectively, the output of the second differential current gate 2 is provided across the output terminals 71 and 72, and when the input terminals 61 and 62 are at a low potential and a high potential, respectively, the output of the first differential current gate 1 is provided across the output terminals 71 and 72. The outputs terminals 71 and 72 are so connected in the circuit that the outputs of the first and second differential current gates 1 and 2, which are opposite in phase to each other, are provided across the output terminals 71 and 72. Therefore, when an input signal Sa as shown in FIG. 2(a) is applied across the input terminals 51 and 52 and a switching signal Sb as shown in FIG. 2(b) is applied across the input terminals 61 and 62, an output Vo whose phase is inverted in response to the switching signal Sb is provided across the output terminals 71 and 72 as shown in FIG. 2(c).

In the above-described example of the phase inverter circuit, both the signal (Sa) input system and the output (Vo) system are of a double end system; however, even if they are of a single end system, the same effect can be obtained.

As is apparent from the above description, according to the invention, the phase inverter circuit is designed so that the number of active circuit elements cascade-connected between the voltage supply terminal Vcc and the ground GND is reduced. The phase inverter circuit is thus operated satisfactorily with a low supply voltage, thus being suitable for use in the form of an integrated circuit. Furthermore, as a phase inverting linear circuit can be combined on the same chip of an integrated circuit including the logic part of a TTL (transistor-to-transistor logic), high speed logic and a linear circuit can be provided in combination.

What is claimed is:

1. A phase inverter circuit, comprising:
   a first differential current gate including first, second and third active elements and a first constant current source;
   a second differential current gate including fourth, fifth and sixth active elements and a second constant current source;
   a first output terminal connected to the output terminals of said first and fourth active elements;
   a second output terminal connected to the output terminals of said second and fifth active elements;
   a first input terminal connected to the input terminals of said first and fifth active elements; and
   a second input terminal connected to the input terminals of said second and fourth active elements, an input signal being applied across said first and second input terminals, and a phase switching signal being applied across input terminals of said third and sixth active elements.

2. A phase inverter circuit comprising:
   a first differential current gate including first, second and third transistors and a first constant current source;
   a second differential current gate including fourth, fifth and sixth transistors and a second constant current source;
   a first output connecting part through which the collectors of said first and fourth transistors are electrically connected to one other;
   a second output connecting part through which the collectors of said second and fifth transistors are electrically connected to one other;
   a first input connecting part through which the bases of said first and fifth transistors are electrically connected to one other,
   a second input connecting part through which the bases of said second and fourth transistors are electrically connected to one other;
   input terminals, by means of which an input signal is applied across said first and second input connecting parts; and
   switching signal input terminals, by means of which a phase switching signal is applied across bases of said third and sixth transistors.

3. A phase inverter circuit as claimed in claim 2, wherein emitters of said first, second and third transistors are connected to said first constant current source, and emitters of said fourth, fifth and sixth transistors are connected to said second constant current source.

4. A phase inverter circuit as claimed in claim 3, wherein when a base voltage of said third and sixth transistors is larger by predetermined amount than base voltages of said first and second, and said fourth and fifth transistors, respectively, said first, second, fourth and fifth transistors are placed in a cut-off state.

5. A phase inverter circuit as claimed in claim 4, wherein when a base voltage of said third and sixth transistors is smaller by a predetermined amount than base voltages of said first and second, and said fourth and fifth transistors, respectively, said third and sixth transistors are placed in a cut-off state.

* * * * *